United States Patent
Eisner et al.

(10) Patent No.: US 8,963,107 B2
(45) Date of Patent: Feb. 24, 2015

(54) BEAM LINE DESIGN TO REDUCE ENERGY CONTAMINATION

(75) Inventors: Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/348,855

(22) Filed: Jan. 12, 2012

(65) Prior Publication Data

US 2013/0181139 A1   Jul. 18, 2013

(51) Int. Cl.
*G01K 5/00* (2006.01)
*H01J 37/147* (2006.01)

(52) U.S. Cl.
CPC .............. *H01J 37/147* (2013.01); *G01K 5/00* (2013.01); *H01J 2237/022* (2013.01)
USPC .................................. 250/492.3; 250/396 R

(58) Field of Classification Search
CPC .............. H01J 2237/0216; H01J 2237/31705; G01K 5/00
USPC ....................................................... 250/492.3
See application file for complete search history.

(56) References Cited

U.S. PATENT DOCUMENTS

| | | | | |
|---|---|---|---|---|
| 2,727,151 | A * | 12/1955 | Parkins | 250/282 |
| 4,560,879 | A * | 12/1985 | Wu et al. | 250/492.2 |
| 4,578,589 | A * | 3/1986 | Aitken | 250/492.2 |
| 4,587,432 | A * | 5/1986 | Aitken | 250/492.2 |
| 5,656,092 | A * | 8/1997 | Blake et al. | 118/723 VE |
| 5,969,366 | A * | 10/1999 | England et al. | 250/492.21 |
| 6,573,517 | B1 * | 6/2003 | Sugitani et al. | 250/492.21 |
| 6,657,188 | B1 * | 12/2003 | Hulet et al. | 250/251 |
| 7,358,508 | B2 * | 4/2008 | Ring et al. | 250/492.21 |
| 7,838,849 | B2 * | 11/2010 | Alcott et al. | 250/492.21 |
| 8,071,958 | B2 * | 12/2011 | Horsky et al. | 250/427 |
| 2001/0050144 | A1 * | 12/2001 | Nishikawa et al. | 156/345 |
| 2003/0066976 | A1 * | 4/2003 | Chen et al. | 250/492.21 |
| 2005/0133736 | A1 * | 6/2005 | Chen et al. | 250/492.21 |
| 2005/0236276 | A1 * | 10/2005 | Kastner et al. | 205/137 |
| 2008/0164427 | A1 * | 7/2008 | Collart et al. | 250/492.21 |
| 2009/0321630 | A1 * | 12/2009 | Ryding et al. | 250/282 |
| 2010/0191042 | A1 * | 7/2010 | Li et al. | 600/35 |
| 2011/0012033 | A1 * | 1/2011 | Colvin | 250/492.21 |
| 2012/0318993 | A1 * | 12/2012 | Boatner et al. | 250/368 |

* cited by examiner

*Primary Examiner* — Jack Berman
*Assistant Examiner* — James Choi
(74) *Attorney, Agent, or Firm* — Eschweiler & Associates, LLC

(57) ABSTRACT

Methods and apparatus for reducing energy contamination can be provided to a beam line assembly for ion implantation. Protrusions comprising surface areas and grooves therebetween can face neutral trajectories within a line of sight view from the workpiece within the beam line assembly. The protrusions can alter the course of the neutral trajectories away from the workpiece or cause alternate trajectories for further impacting before hitting a workpiece, and thereby, further reduce energy contamination for more sensitive implants.

18 Claims, 5 Drawing Sheets

BEAM LINE DESIGN TO REDUCE ENERGY CONTAMINATION

FIELD

The present disclosure relates generally to ion implantation systems, and more particularly to a system and method for reducing energy contamination caused by scattered particles.

BACKGROUND

Ion implantation is a physical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof.

In ion implantation, energy contamination (EC) is the fraction of the total dose delivered to a wafer at an undesired energy, thereby causing a deeper or shallower implantation than desired. For example, in ion implanters that decelerate the ion beam prior to reaching a workpiece, EC can be a major problem because it can result in poor device performance. EC can result from various processes within the ion implantation system (such as within an accelerator or decelerator located along a beam path) that may act to cause ions to change their initial charge value (e.g., a charge exchange reaction). When a high speed ion comes in close proximity to another molecule or atom of a gas, the ion may pick up an electron from the molecule or atom (i.e., an electron "picking up" reaction), or may lose an electron to the molecule or atom (i.e., a charge stripping reaction). The former reaction reduces the value of ion charge by one; for example, a singly charged ion can become a neutral, that is, an electrically neutral atom. The latter increases the value of ion charge by one (e.g., a singly charged ion becomes a doubly charged ion). Because most EC arises from charge-exchange in the ion beam, the traditional method of reducing energy contamination focuses on minimizing charge exchange reactions.

However, only focusing on minimizing charge exchange can neglect other sources of EC. Accordingly, suitable systems and methods for providing more sensitive implants while further minimizing EC are desired.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

The present disclosure is directed towards a beam line assembly that employs a structure (e.g. a beam tunnel) comprising a plurality of protrusions comprising serrations or grooves cut into the walls therein to mitigate or remove the total number of forward scattered neutrals affecting a quality of implantation. The plurality of protrusions can comprise surface areas that vary in size, shape, and angle with respect to their position along the beam tunnel. In one aspect, the grooves can comprise a spacing that varies with respect to their position along the beam tunnel.

In another embodiment, methods provide for reducing energy contamination by calculating particle trajectories. Protrusions comprising grooves between them can be provided along an ion beam path within a line of sight view from a workpiece in order to impact and reflect ions from the calculated trajectories. The line of sight view from the workpiece can be downstream of a deceleration lens, a fraction of the apparatus upstream of the deceleration lens and/or in the deceleration lens, for example.

To the accomplishment of the foregoing and related ends, the following description and annexed drawings set forth in detail certain illustrative aspects and implementations of the disclosure. These are indicative of but a few of the various ways in which the principles of the disclosure may be employed. Other aspects, advantages and novel features of the disclosure will become apparent from the following detailed description of the disclosure when considered in conjunction with the drawings.

DETAILED DESCRIPTION

Figure 1:
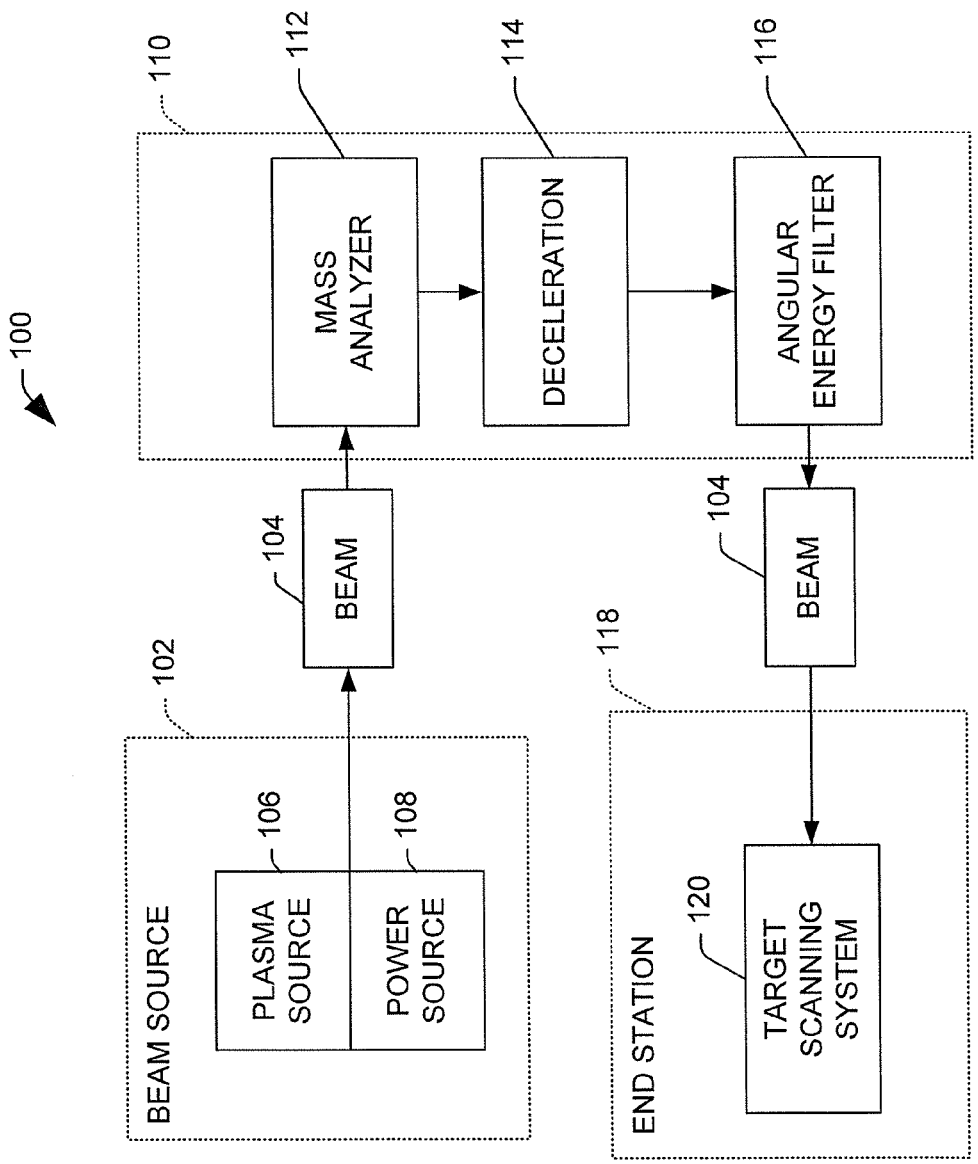
FIG. 1 is a schematic block diagram illustrating components of an ion implantation system in accordance with one or more aspects of the present disclosure.

The present disclosure will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present disclosure and the appended claims.

Many ion implantations performed in current semiconductor fabrication processes are shallow and/or ultra-shallow implants that form shallow and/or ultra-shallow junction depths in formed devices. These shallow and/or ultra-shallow implants typically employ low energies (e.g., 1 keV), but require relatively high beam current. Generally, it is appreciated that high-current, low-energy ion beams are obtained by extracting the ion beam from an ion source at a relatively high energy. Then, the ion beam is mass purified and transported to a position relatively close to a target workpiece. Subsequently, the ion beam is decelerated to a selected low energy level and is then transported to the target workpiece. However, the ion beam can include energy contaminants that are unaffected by the deceleration (e.g., neutral particles since they have no charge), and therefore, penetrate a target workpiece to level different than desired. As a result, the energy contaminants can damage underlying components and/or other portions of the target workpiece, resulting in a potential loss of process control.

The present disclosure facilitates ion implantation by mitigating or removing energy contaminants from ion beams, and particularly low energy ion beams. An ion implantation system or beam line assembly of the present disclosure can employ multiple grooves within different zones utilized for impacting those neutral particles affecting energy contamination. The grooves can separate protrusions that vary among the different zones and can be aligned approximately at right angles with respect to neutral particle trajectories within a line of sight view from the workpiece.

Referring initially to FIG. 1, an ion implantation system 100 suitable for implementing one or more aspects of the present disclosure is depicted in block diagram form. The system 100 includes an ion beam source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted.

A beam line assembly 110 is provided downstream of the ion source 102 to receive the beam 104 therefrom. The beam line assembly 110 includes a mass analyzer 112, a deceleration structure 114, which may include, for example, one or more gaps, and an angular energy filter 116. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The deceleration gap or gaps within the deceleration structure 114 can be operable to decelerate ions within the beam to achieve a desired depth of implantation in a workpiece. Accordingly, it will be appreciated that while the terms decelerator and/or deceleration gap may be utilized herein in describing one or more aspects of the present disclosure, such terms are not intended to be construed narrowly so as to be limited to a literal interpretation of deceleration, but are to be construed broadly so as to include, among other things, acceleration as well as changes in direction. It will be further appreciated that acceleration/deceleration means may be applied before as well as after the magnetic analysis by the mass analyzer 112.

It is appreciated that contaminating particles, also referred to as energy contaminants, include neutral and/or other non-selected energy ranges that may be produced within the ion beam 104 by collisions among ions and background or residual particles. Such encounters can cause some of the ions to exchange charges with the background or other particles thereby becoming neutral particles or contaminants. These neutral particles can be implanted onto the wafer in areas that are to be doped with ions, thereby diluting the intended level of doping and adversely affecting the doping process. More importantly, because these particles are electrically neutral they can pass through the decelerator, for example, and more particularly through electrostatic fields generated by the electrodes unaffected (e.g., without being accelerated, decelerated, focused, bent or otherwise altered in speed and/or direction). As such, these particles can be implanted into the wafer at undesired depths as their (unaffected) energy levels will likely differ from the energy levels of the bent, focused, accelerated and/or decelerated ions in the ion beam that have passed through and been adjusted by the accelerator/decelerator. This neutral particle contamination can severely degrade the desired performance of resulting semiconductor devices.

An angular energy filter 116 receives the accelerated/decelerated ions from the deceleration gap(s) 114 and selects ions within a specific energy range and excludes contaminating particles, including neutrals and ions having other energies, from the ion beam 104. The angular energy filter 116 employs deflection plates, focusing electrodes, and edge electrodes to alter a path of ions within the specific energy range and allows those ions to pass through a slit or aperture. Otherwise, the non-selected ions do not pass through the slit and are thereby prevented from contaminating the wafer. The deflection plates can cause the selected ions to be deflected at a selected angle from the path of the energy contaminants, which also happens to be the original path of the ion beam 104 as the neutral energy contaminants are unaffected by the deflection plates since the contaminants are electrically neutral. The beam of ions is directed onto the workpiece to encounter select areas of the workpiece to be doped. It will be appreciated that some type of barrier can, for example, be placed in front of the stream of energy contaminants to prevent the contaminants from encountering the workpiece or wafer, as with a contamination dump (not shown).

Although the energy filter 116 may filter energy contaminates well, those produced from scattering can still be a problem. For example, while most ions travel unobstructed through the beam line of the implanter, some hit apertures and enclosing walls therein. For example, space charge forces can increase the size of the cross-section of the ion beam until the beam strikes the surfaces of the vacuum enclosure or the opening in a resolving aperture (e.g. a mass-resolving aperture). When an ion impacts a surface it can get embedded into the material below the surface, or reflected by the surface and reenter the beam line. This reflection is commonly termed "scattering," and if the direction of the particle after scattering is in the initial direction, the scattering is called "forward scattering."

An end station 118 is also provided in the system 100 to receive the mass analyzed decontaminated ion beam 104 from the beam line assembly 110. The end station 118 supports one or more workpieces such as semiconductor wafers (not shown) along the beam path for implantation using the mass analyzed decontaminated ion beam 104. The end station 118 may comprise a target scanning system 120 for translating or scanning one or more target workpieces and the ion beam 104 relative to one another. The target scanning system 120 may provide for batch or serial implantation, for example, as may be desired under given circumstances, operating parameters and/or objectives.

Figure 2:
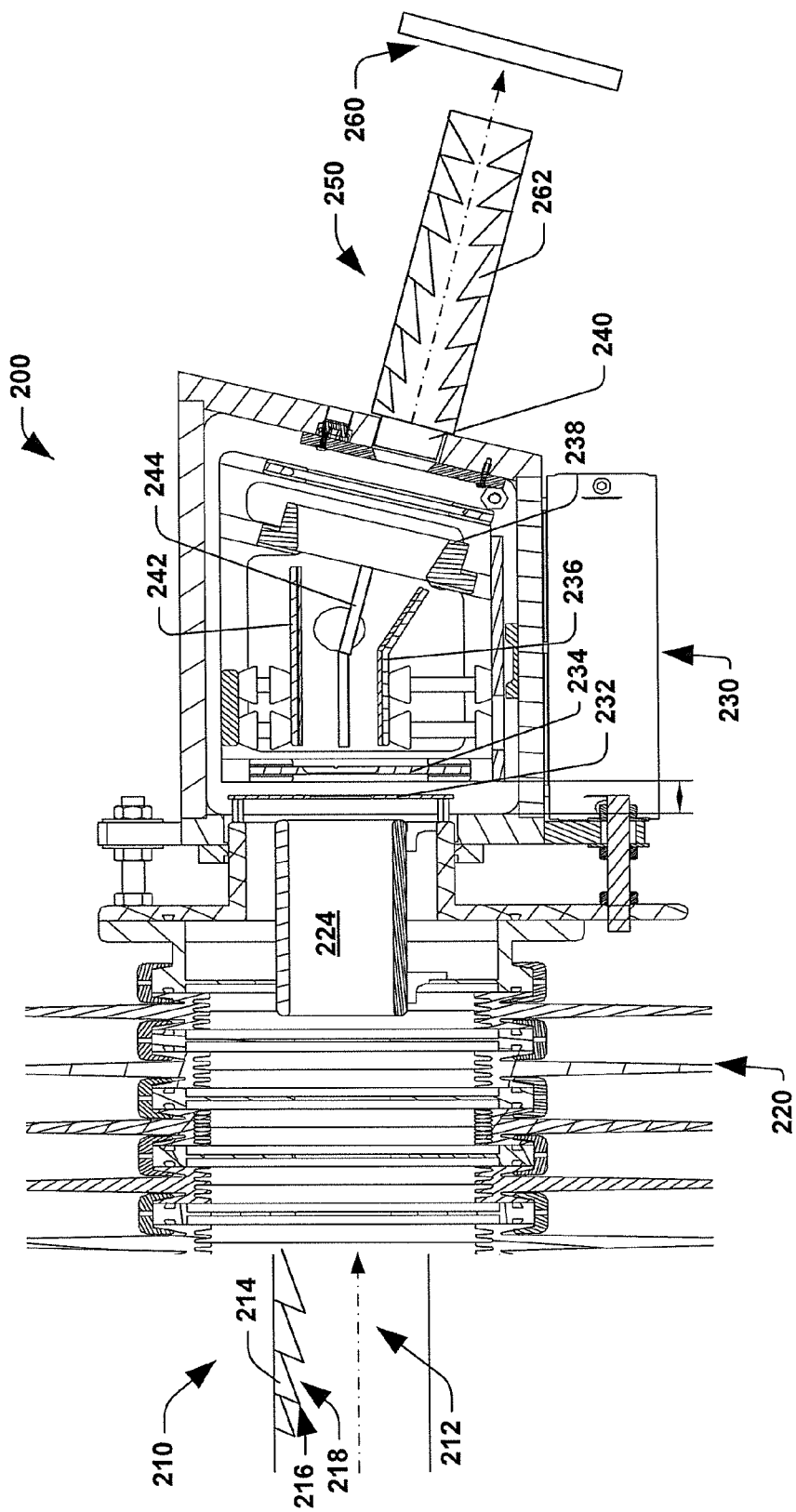
FIG. 2 is a schematic block diagram illustrating beam line assembly portion of an ion implantation system near an end-station in accordance with one or more aspects of the present disclosure.

FIG. 2 is a horizontal cross sectional view of a section of a beam line assembly 200 in accordance with an aspect of the present disclosure. The beam line assembly 200 causes an incident ion beam to reduce its energy levels to a desired level, removes energy contaminants from the ion beam, and directs the ion beam toward a target (e.g., a wafer or workpiece 260). In one embodiment of the disclosure, the beam line assembly 200 comprises a series of protrusions or a plurality of protrusions 214, for example, to further reduce energy contamination by reducing the number of scattered high-energy particles that hit the workpiece 260.

The beam line assembly 200 comprises a deceleration component 220 and may also comprise a tube focus component 224. The deceleration component 220 can comprise a number of stages that successively decelerate an incoming ion beam along an ion beam path 212 as it travels through the component 220. The stages comprise electrodes arranged and biased to decelerate (or accelerate) ions. The tube focus component 224 can be supported by insulators from the deceleration component 220, so that it can be biased independently to a negative potential that focuses the ion beam along ion beam path 212 in a vertical direction, and allows the ion beam to decelerate more but maintain an energy higher than the final energy by the potential of the tube focus voltage while the ions are substantially within component 224. The tube focus component 224 can be rectangular in shape and also wider in the horizontal direction, for example. A grounding plate 232 can also be present, for example, on the other side of the tube focus component 224 that can terminate electric fields therefrom.

In one embodiment, the beam line assembly 200 can further comprise an angular electrostatic filter 230 or deflection filter that can be operatively coupled to the tube component 224 to filter energy contaminants from the ion beam. The angular electrostatic filter 230 can comprise an entrance electrode 234, an exit electrode 238, a top deflection plate 242, a bottom deflection plate 236, an edge electrode 244, and an exit slit 240, for example. The entrance electrode 234 and exit electrode 238 can comprise apertures that permit passage of the ion beam there through. The entrance electrode 234 and the exit electrode 238 are operative to accelerate the ion beam into the deflecting region and decelerate the beam after the deflecting region.

Energy contaminants, including neutral contaminants, do not bend or do not bend at the specific angle, and as a result, the majority of neutral contaminants do not pass through the exit slit 240 and/or a more limiting slit closer to the target. The angled portion of the bottom deflection plate 236 can facilitate proper deflection of the selected ions so that a relatively large beam can bend to the desired path without hitting the bottom plate. The exit slit 240 can, for example, be biased to 0 V or ground, which causes the beam to decelerate after passing the exit focus electrode 238. The beam is decelerating to the final energy as it exits the fields of the deflecting plates 242 and 236 and the exit focus electrode 238. It is also completing the bend of the deflection. There are only short segments of these trajectories in which ions can be neutralized while at higher potentials and still have completed the bend enough to pass through blocking slits. This shorter path mitigates the possibility of neutral ions heading towards the target compared to conventional devices, which can have a significant drift distance at a constant energy preceding the decel gap.

Forward scattered neutrals do not usually follow the trajectories of beam ions because they are not subject to the electric and magnetic forces of the implanter, as stated above. For example, an electric bending filter before or after a decel lens or the deceleration component 220 can act to remove energetic charged particles from the ion beam path 212, but does not modify the trajectory of an energetic neutral. If the energetic, forward scattered neutral reaches the workpiece it will cause energy contamination.

In one aspect of the disclosure, neutral particles that are forward scattered can be reduced substantially by allowing the beam line assembly 200 to comprise a plurality of protrusions along the ion beam path 212 that can comprise various shapes, sizes and angles than what is illustrated in FIG. 2 and among one another. For example, a plurality of protrusions 214 can be present within a beam tunnel or beam guide 210 prior to the deceleration component 220, within the deceleration component, and/or after the deceleration component 220 in a second beam guide or tunnel 250, as with protrusions 262 surrounding the walls of a beam guide 250. These protrusions 214 can comprise serrated surfaces comprising surface areas 216 and grooves 218 therebetween, as an example.

In one embodiment, the protrusions 214 and 262 within the beam tunnel 210 and 250 respectively, and/or on at least one electrode within the deceleration component 220 can gradually change, or change among different zones (not shown), as a function of position along the ion beam path 212. The surface areas of the protrusions, for example, can be configured to face trajectories of neutral particles within the ion beam path to prevent forward scattering. For example, the surface areas can be configured at approximately ninety degrees with respect to the trajectories of the neutral particles. The neutral particles and ion trajectories can be modeled in order to predict the various angles upon which the walls of the beam line assembly may be impacted for the particular ion beam path. Consequently, the protrusions of one embodiment can face the path of the neutral particles along the modeled or calculated trajectories to ensure that the particles are reflected in a different trajectory away from the workpiece and/or in a trajectory causing at least one more impact within the beam line assembly before implanting the workpiece 260.

In one embodiment, the location of the protrusions in the beam guide 210 and 250 and/or within the deceleration component 220 can be within a line of sight view from the workpiece 260. In other words, a line of sight view can be the walls and components within an optical axis or connecting line from the workpiece and along the ion beam path 212 that does not intersect any other structure or component therein. For example, the protrusions can surround the walls of the tunnel 250 and also be on the side or wall of beam guide 210, as it is in view of the workpiece 260.

Figure 3:
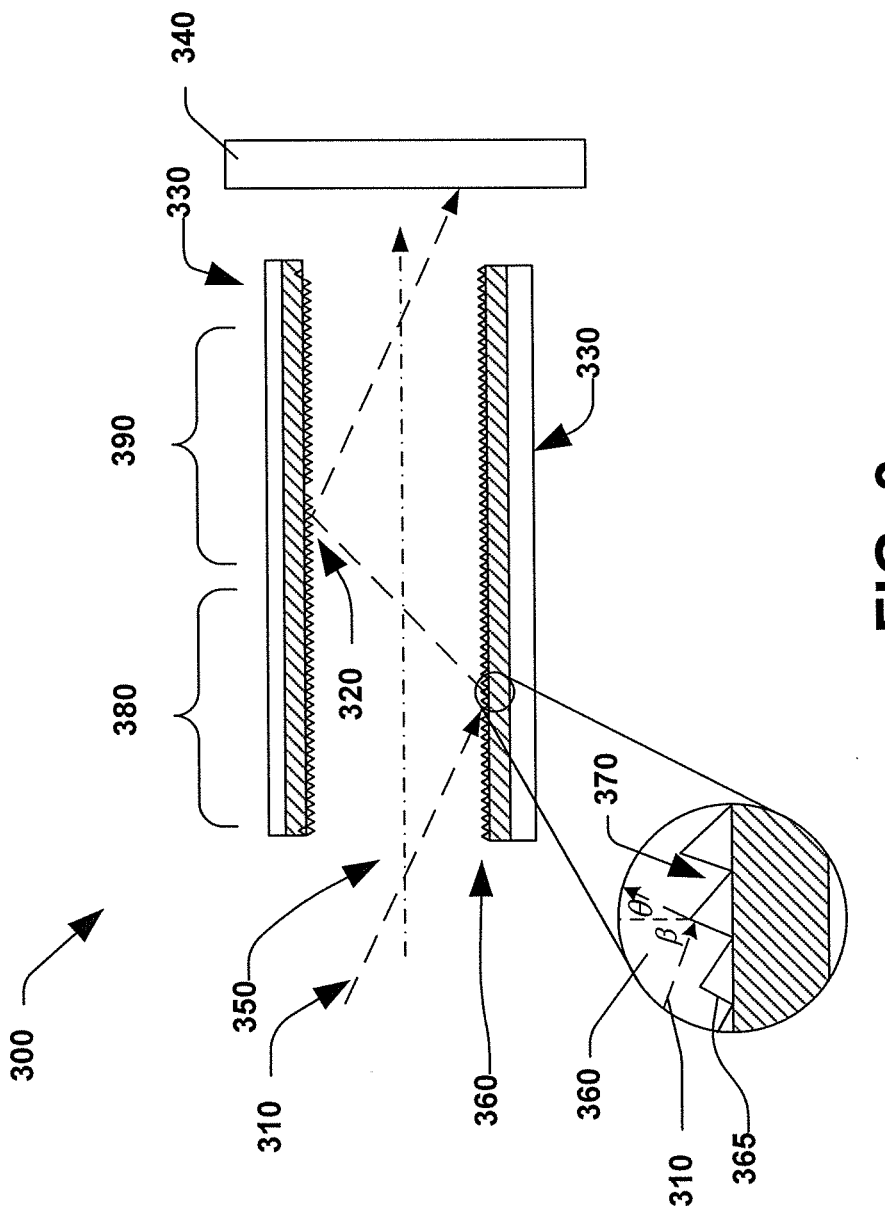
FIG. 3 is a schematic block diagram illustrating a portion of a beam guide within a beam line assembly downstream of a deceleration component, for example, in an ion implantation system in accordance with one or more aspects of the present disclosure.

FIG. 3 is a side and sectional view of a beam guide 300 in accordance with one aspect of the disclosure. The beam guide 300 comprises walls 330 along an ion beam path 350, in which an ion beam may travel. The walls 330 can support protrusions 360 that can surround the beam guide 300 and be configured to impact and reflect neutral particles in trajectories, such as a trajectory 310, away from a workpiece 340 and/or in a trajectory 320 causing at least one more impact within a beam line assembly before implanting the workpiece 340.

The beam tunnel 350 can be located downstream, for example, of a deceleration lens (not shown) within the beam line assembly. In one embodiment, the protrusions 360 can comprise serrations or grooves 370 cut or etched into the walls 330 of the beam tunnel. The grooves 370 can be configured to be approximately ninety degree angles with respect to the trajectory 310 of a neutral particle. For example, as the angle of incidence Beta changes with respect to the ion beam path, the angle Theta of a surface area 365 striking the neutral particles can also change in order to impact various particle trajectories at approximately ninety degrees. While the protrusions 360 are illustrated within the beam tunnel 350, other protrusions (not shown) with similar features can be present within other components of a beam line assembly and sections therein within an optical view of the workpiece 340 for reducing energy contamination.

In one embodiment, the grooves 370 can change with respect to their position along the ion beam path 350. For example, protrusions 360 can change gradually along the ion beam path 350. In a further example, the protrusions 360 can change according to zones. For example, a zone 380 may comprise a different set of protrusions having grooves and surface areas of different angles, size, depth and/or spacing from one another than the protrusions of a zone 390. By modeling the particle trajectories the protrusions of zone 380 and 390 can respectively be designed to optimally impact the particles and reflect them in a trajectory away from the workpiece, and/or into a trajectory causing at least one more impact of the particle within the beam line assembly before implanting the workpiece. Consequently, the grooves 365 can be configured to prevent and/or reduce forward scattering of neutral particles in particular. For example, the protrusions or plurality of protrusions can comprise depths of about 1 mm to 7 mm, for example 3 mm, although any optimal depth can be envisioned. Further, the protrusions can comprise hundreds of protrusions on a surface, for example, four hundred protrusions with respective grooves and surface areas for impacting particles within a line of sight view of the workpiece 340. In one embodiment of the invention, all the surfaces are textured, for example, as set forth in U.S. Pat. No. 7,358,508 and U.S. Patent Publication No. 2011/0012033, both assigned to Axcelis Technologies, Inc., to reduce particle generation. Such references are herein incorporated by reference in their entirety.

Figure 4:
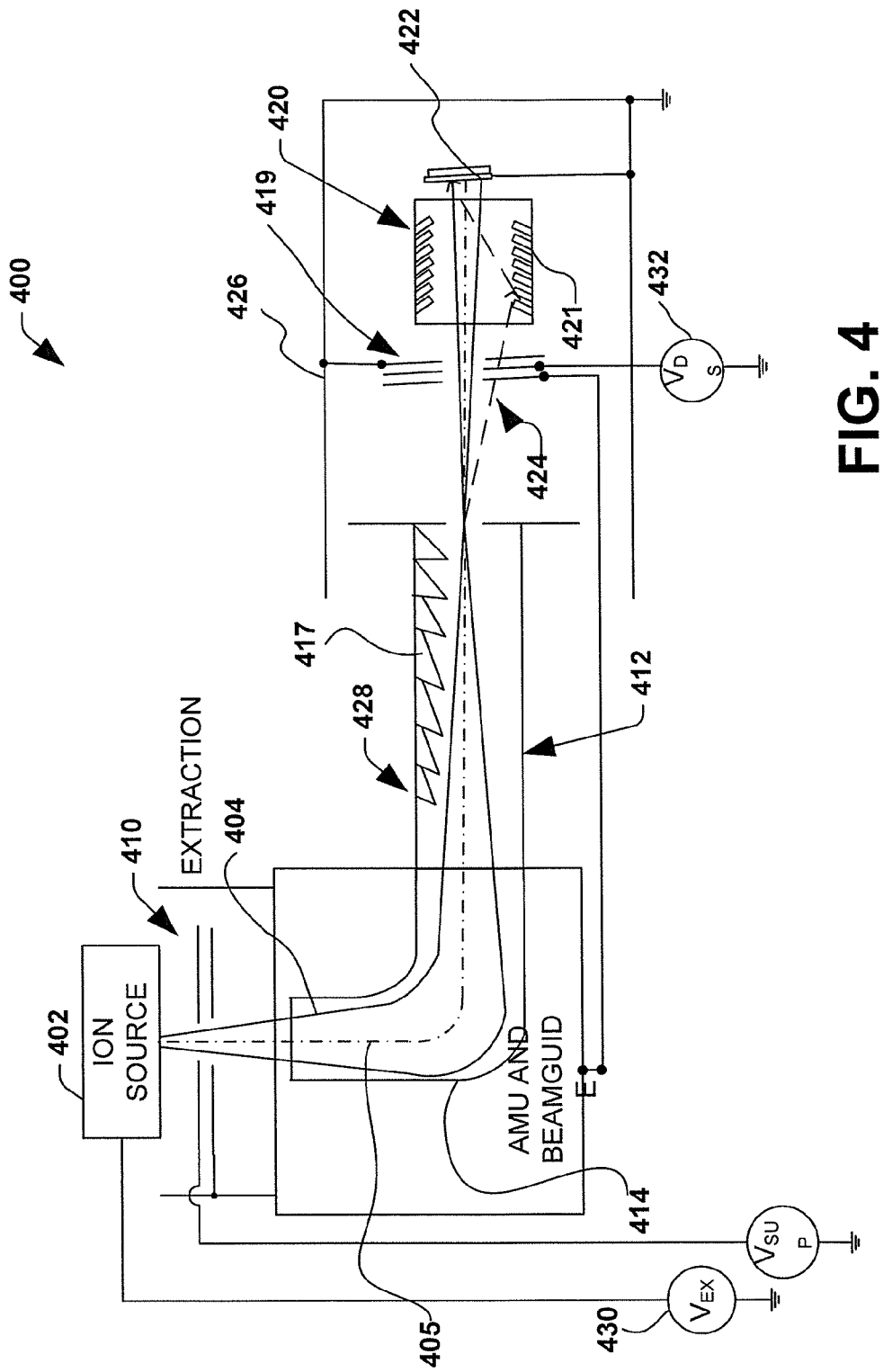
FIG. 4 is a schematic block diagram illustrating components of an ion implantation system, and more particularly first and second beam tunnels along a beam guide in accordance with one or more aspects of the present disclosure.

FIG. 4 illustrates an example ion implantation system 400 without an energy filter in accordance with an aspect of the present disclosure. The system 400 is presented for illustrative purposes and it is appreciated that aspects of the disclosure are not limited to the described ion implantation system 400 and that other suitable ion implantation systems of varied configurations can also be employed, as with prior systems described above.

The ion implantation system 400 comprises an ion source 402 for producing an ion beam 404 along a longitudinal ion beam path 405. The ion beam source 402 includes a plasma source with an associated extraction power source 430 and an extraction apparatus 410, which may be of any design by which the ion beam 404 is extracted.

It can be appreciated that since the ion beam 404 comprises like charged particles, the beam 404 may have a tendency to blow up or expand radially outwardly as the like charged particles repel one another. It is also to be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles. Accordingly, the extraction assembly is generally configured so that the beam 404 is extracted at a high energy so that the beam blow up is minimized. Nevertheless, space-charge forces can still increase the cross-section of the beam until the beam strikes surfaces of the vacuum enclosure or an opening in a resolving aperture, for example, and thus, cause ions to impact surfaces and reenter the beam path 405 as neutral particles. Moreover, in decel mode, the beam 404, in this example, is generally transferred at a relatively high energy throughout the system 400 and is reduced at the deceleration element 419 before impacting with a workpiece 422 to promote beam containment.

A first beam tunnel 412 can be provided downstream of the ion source 402 to receive the beam 404 therefrom, comprising a mass analyzer 414 positioned along the path to receive the beam 404. A second beam tunnel 420 can be provided downstream of the deceleration element 419 for further reducing energy contaminates therein. The first beam tunnel 412 and second beam tunnel 420 can respectively comprise a plurality of protrusions 417 and 421. The plurality of protrusions 417 and 421 can respectively comprise surface areas and grooves for reflecting neutral particles away from the workpiece 422 or to at least one more impact surface before impacting the workpiece 422.

In one embodiment, the protrusions 417 and 421 can be located within a line of sight view from the workpiece 422, which can comprise a point 428 in the first beam tunnel 412 that is before the mass analyzer/bend in the ion beam path 405, along a wall or side of the first beam tunnel, the deceleration element 419 and the second beam tunnel 420. FIG. 4 illustrates the protrusions 421 and 417 respectively surrounding the ion beam path 405 and on one wall of the beam tunnel 412. Protrusions (not shown) for reducing energy contamination may also be in the deceleration element 419, for example, such as on one of the positive electrodes thereat. The protrusions within the line of sight view of the workpiece 422 can vary in size, shape, depth and spacing according to their position along the ion beam path. In addition, the protrusions can comprise surfaces areas angled at approximately ninety degrees to neutral particle trajectories, such as a neutral trajectory 424. By facing neutral trajectories as face-on as possible, the protrusions are configured to impact and reflect the neutral particles away from the workpiece and/or in a trajectory causing at least one more impact within the beam line assembly 400 before implanting in the workpiece 422.

One or more deceleration electrodes forming the deceleration element 419 can be located upstream or downstream of an energy filter (not shown) for reducing contamination further, or alternatively an energy filter may not be present as in FIG. 4. Further, an end station 426 is provided in the system 400, which receives the mass analyzed ion beam 404 from the beam line 412 and a target scanning system supports one or more workpieces 422 such as semiconductor wafers along the path for implantation using the final mass analyzed ion beam 404. A decel suppression power 432 supply connects to the middle electrode of the decel elements. These power supplies can be adjusted to give expected ion beam performance, the right bending angle, the final ion beam energy, and the optimized focusing.

In view of the foregoing structural and functional features described supra, methodologies in accordance with various aspects of the present disclosure will be better appreciated with reference to the above figures and descriptions. While, for purposes of simplicity of explanation, the methodologies described below are depicted and described as executing serially, it is to be understood and appreciated that the present disclosure is not limited by the illustrated order, as some aspects could, in accordance with the present disclosure, occur in different orders and/or concurrently with other aspects from that depicted and described herein. Moreover, not all illustrated features may be required to implement a methodology in accordance with an aspect the present disclosure.

Figure 5:
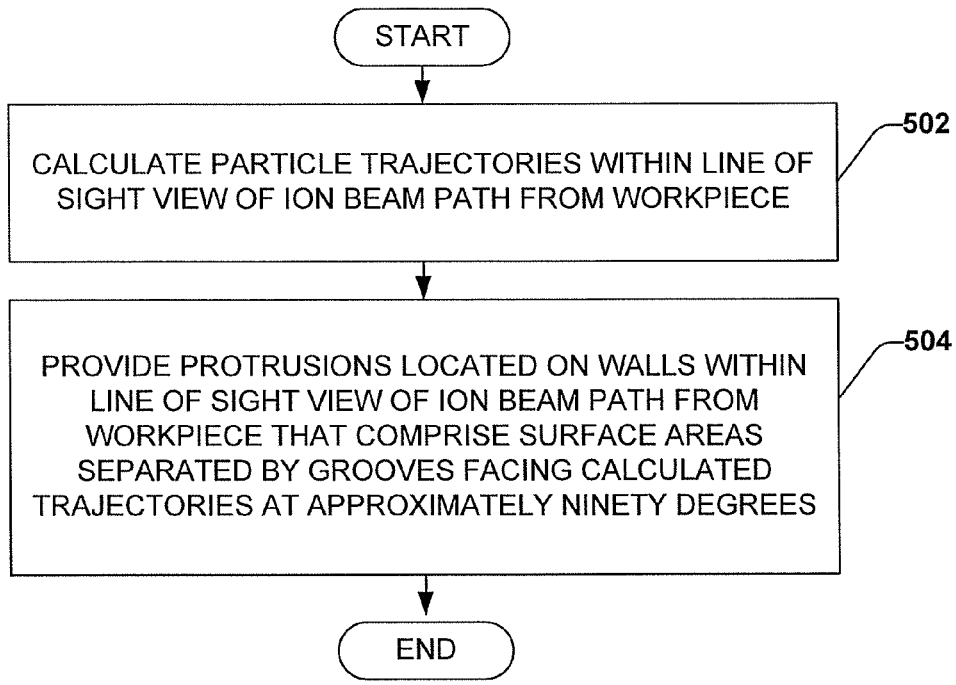
FIGS. 5 and 6 are flow diagrams respectively illustrating a method for removing energy contaminants in accordance with one or more aspects of the present disclosure.
Figure 6:
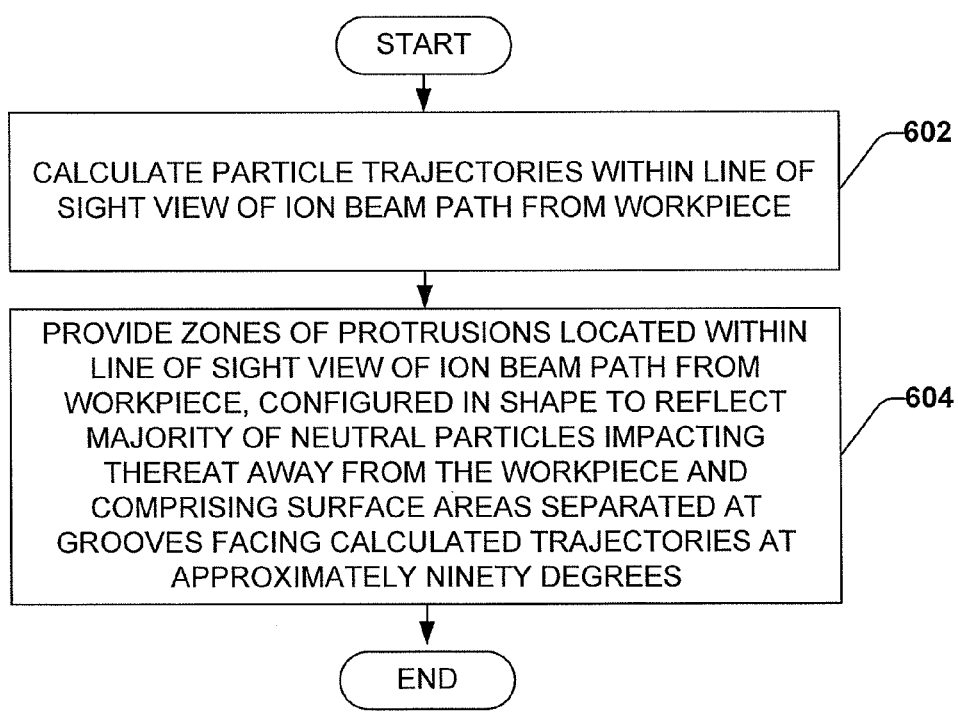

Referring now to FIGS. 5 and 6, exemplary methodologies 500 and 600 are illustrated respectively for removing energy contaminants from an ion beam path in accordance with aspects of the present disclosure. Although the methodologies 500 and 600 are illustrated and described hereinafter as a series of acts or events, it will be appreciated that the present disclosure is not limited by the illustrated ordering of such acts or events. For example, some acts may occur in different orders and/or concurrently with other acts or events apart from those illustrated and/or described herein, in accordance with one or more aspects of the present disclosure. In addition, not all illustrated steps may be required to implement a methodology in accordance with the present disclosure. Furthermore, the methodologies according to the present disclosure may be implemented in association with the formation and/or processing of structures illustrated and described herein as well as in association with other structures not illustrated.

The method 500 of FIG. 5 is initialized at start and begins at block 502. Particle trajectories (e.g. neutral particle trajectories) are calculated within a line of sight view of an ion beam path from a workpiece at 502. In one embodiment, the line of sight view of the ion beam path from the workpiece can comprise the ion beam path downstream of a deceleration lens and extends to a portion of the ion beam path upstream of the deceleration lens to a point before the beam tunnel ends. The point before the beam tunnel ends can comprise a point before the side of the beam tunnel bends at a different angle to not be seen from the workpiece.

At 504 protrusions are provided at walls within the line of sight view of the ion beam path from the workpiece. The protrusions can comprise surface areas separated by grooves respectively that face the calculated trajectories at approximately ninety degrees with respect to the trajectory. In one embodiment, the protrusions can comprise angles respectively that differ as a function of position along the ion beam path. The protrusions are configured to impact and reflect neutral particles in a trajectory away from the workpiece and/or in a trajectory causing at least one more impact within the beam line assembly before implanting the workpiece. Further, the grooves between the protrusions can comprise depths, sizes, and/or spacing that respectively differ and are configured to prevent forward scattering of neutral particles. The flat faces of the grooves and protrusions can be textured according to one embodiment. The grooves can be 1 mm to 7 mm deep, for example, and located on walls surrounding the ion beam path downstream of the deceleration lens and a wall upstream of the deceleration lens. The deceleration lens, for example, may also comprise at least one electrode where protrusions are located thereon, such as a positive electrode. Furthermore, the grooves can comprise at least 100 grooves. In addition, the trajectories may comprise different angles of incidence with respect to the walls of the beam line assembly along the beam line path within the line of sight view of the workpiece. The method finalizes at end.

FIG. 6 illustrates the method 600 that initializes at start. The method 600 begins at 602 where particle trajectories are calculated within a line of sight view of an ion beam path from a workpiece. The trajectories can be modeled so their paths can be predicted within the line of sight view from the workpiece in a beam line assembly.

At 604 a plurality of zones comprising protrusions respectively are provided. The zones are located within the line of sight view of the ion beam path from the workpiece and can be configured in shape to reflect a majority of neutral particles impacting thereat. The particles can be reflected away from the workpiece by the protrusions comprising surface areas separated by grooves facing the calculated trajectories at approximately ninety degrees. In one embodiment, the plurality of zones can comprise protrusions with angles that differ among the zones as a function of position along the ion beam path. The method finalizes at end.

Although the disclosure has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure. In this regard, it will also be recognized that the disclosure may include a computer-readable medium having computer-executable instructions for performing the steps of the various methods of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A method of removing energy contaminants from an ion beam path of a beam line assembly having a mass analyzer, a deceleration lens downstream of the mass analyzer, and an energy filter located downstream of the deceleration lens, comprising:
generating calculations of different particle trajectories of neutral particles of the ion beam path within a line of sight view of the ion beam path from a workpiece;
providing protrusions located on walls surrounding the ion beam path downstream of the energy filter within the line of sight view of the ion beam path from the workpiece and comprising surface areas respectively separated by grooves that face the different particle trajectories differently as a function of the calculations of the different particle trajectories of the neutral particles and at approximately ninety degrees with respect to the different particle trajectories of the neutral particles, wherein the protrusions are oriented transverse to the ion beam path.

2. The method of claim 1, wherein the line of sight view of the ion beam path from the workpiece comprises the ion beam path downstream of the deceleration lens and extends to a portion of the ion beam path upstream of the deceleration lens on a side of a beam tunnel to a point before the beam tunnel ends.

3. The method of claim 1, wherein the protrusions respectively comprise angles that differ as a function of position along the ion beam path, and are configured to impact and reflect neutral particles in a trajectory away from the workpiece and/or in a trajectory causing at least one more impact within the beam line assembly before implanting the workpiece.

4. The method of claim 1, wherein the grooves comprise depths, sizes and/or spacing therebetween that respectively differ and are respectively configured to reduce forward scattering of neutral particles.

5. The method of claim 2, wherein the point before the beam tunnel ends comprises a point before the side of the beam tunnel bends at a different angle to not be seen from view of the workpiece, and wherein the trajectories comprise different angles of incidence with respect to the walls.

6. The method of claim 1, wherein the grooves comprise a depth of about 1 mm to 7 mm and are located on walls surrounding the ion beam path downstream of a deceleration lens and a wall upstream of the deceleration lens.

7. The method of claim 1, wherein the protrusions comprises at least 100 grooves, and the grooves are located on a wall upstream of a deceleration lens, on at least one electrode of the deceleration lens, and walls downstream of the deceleration lens.

8. The method of claim 1, wherein the deceleration lens comprises at least one electrode comprising the protrusions with the surface areas separated by grooves thereon, and wherein the protrusions are configured to impact and reflect neutral particles in a trajectory away from the workpiece or in a trajectory causing at least one more impact within the beam line assembly before reaching the workpiece.

9. A method of removing energy contaminants from an ion beam path of a beam line assembly having a mass analyzer, a deceleration lens downstream of the mass analyzer, and an energy filter located downstream of the deceleration lens, comprising:
calculating various particle trajectories of neutral particles of the ion beam path within a line of sight view of the ion beam path from a workpiece; and
providing a plurality of zones respectively comprising protrusions located within the line of sight view of the ion beam path from the workpiece and configured in shape to reflect neutral particles impacting thereat away from the workpiece, the protrusions comprising surface areas respectively separated by grooves that face the various particle trajectories respectively at approximately ninety degrees and face differently from one another based on the calculated various particle trajectories of the neutral particles,
wherein the plurality of zones respectively comprise the protrusions with angles that differ among the plurality of zones as a function of longitudinal position along the ion beam path,
wherein a first zone of the plurality of zones is downstream of the mass analyzer and upstream of the deceleration lens, and a second zone of the plurality of zones is distinct from the first zone and is downstream of the energy filter.

10. The method of claim 9, wherein the line of sight view of the ion beam path from the workpiece comprises a portion of the ion beam path surrounding the ion beam path downstream of a deceleration lens, and further comprises a portion of the ion beam path upstream of the deceleration lens that is within optical view from the workpiece.

11. The method of claim 9, wherein the grooves comprise depths, sizes and/or spacing therebetween that respectively differ and are respectively configured to reduce forward scattering of neutral particles.

12. The method of claim 9, wherein the protrusions in the plurality of zones are configured to impact and reflect neutral particles in a trajectory away from the workpiece and/or in a trajectory causing at least one more impact within the beam line assembly before implanting the workpiece.

13. The method of claim 9, wherein the surface areas of the protrusions differ in shape among the plurality of zones with respect to position along the beam path.

14. A beam line assembly comprising:
an ion beam source for generating an ion beam in an ion beam path for implantation of a workpiece;
a decelerator component downstream of an mass analyzer component in the ion beam path that selectively decelerates the generated ion beam;
an energy filter downstream of the decelerator component;
a beam tunnel downstream of the energy filter, the beam tunnel comprising protrusions located on walls surrounding the ion beam path; and
a beam tunnel upstream of the decelerator component comprising the protrusions located on a portion of the beam tunnel upstream, wherein the protrusions both downstream and upstream of the decelerator component are oriented transverse to the ion beam path;
wherein the protrusions comprise surface areas separated by grooves facing neutral particle trajectories differently from one another as a function of trajectory calculations of the neutral particle trajectories and at approximately ninety degrees thereon and are respectively configured to impact and reflect neutral particles in a trajectory away from the workpiece and/or in a trajectory causing at least one additional impact within the beam line assembly before implanting the workpiece.

15. The beam line assembly of claim 14, further comprising a deflection filter that removes energy contaminants from the ion beam and directs the ion beam toward the workpiece.

16. The beam line assembly of claim 14, wherein the protrusions respectively comprise angles that differ as a function of position along the ion beam path, and the grooves comprise depths, sizes, and distances therebetween that respectively differ to reduce forward scattering of neutral particles.

17. The beam line assembly of claim 14, wherein the deceleration component comprises at least one electrode comprising the protrusions thereon.

18. The method of claim 9, wherein the protrusions are oriented transverse to the ion beam path.

* * * * *